(12) United States Patent
Nitz et al.

(10) Patent No.: US 6,496,062 B1
(45) Date of Patent: Dec. 17, 2002

(54) PREDISTORTION SYSTEM AND METHOD USING A PILOT SIGNAL

(75) Inventors: William Allen Nitz, Rockaway Township, Morris County, NJ (US); Josef Ocenasek, Whippany, NJ (US); Christopher F. Zappala, Annandale, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/904,611

(22) Filed: Jul. 13, 2001

(51) Int. Cl.⁷ .................................................. H03F 3/66
(52) U.S. Cl. ........................... 330/52; 330/136; 330/149
(58) Field of Search ........................... 330/52, 136, 149

(56) References Cited

U.S. PATENT DOCUMENTS 5,266,906 A * 11/1993 Inahashi .................... 330/52 X
5,963,090 A * 10/1999 Fukuchi .................... 330/136 X

* cited by examiner

Primary Examiner—Steven J. Mottola

(57) ABSTRACT

A predistortion system uses a pilot signal to determine a predistortion function which is used to produce amplitude and/or phase adjustment(s) of an input signal on a signal path. Rather than simply detecting the input signal envelope before and after distortion generating circuitry, such as an amplifier, a pilot signal is provided on the signal path prior to the distortion generating circuitry. After the distortion generating circuitry, the pilot signal is detected. The predistortion system can determine the predistortion function by using the generated pilot signal and the detected pilot signal, for example, to provide improved characterization of the amplifier amplitude and/or phase response or to directly improve the determination of the predistortion function. In certain embodiments, the predistortion function is implemented using a look-up table to produce the amplitude and/or phase adjustment values, and the pilot signal is produced on the signal path by adding the pilot signal to the amplitude and/or phase adjustment values of the look-up table.

7 Claims, 2 Drawing Sheets

50

PREDISTORTION SYSTEM AND METHOD USING A PILOT SIGNAL

BACKGROUND OF THE INVENTION

1. Field of the Invention

This invention relates to communications, and, more particularly, to a system and method for reducing distortion using predistortion.

2. Description of Related Art

An ideal power amplifier amplifies an input signal with no waveshape alteration. The ideal power amplifier is therefore characterized as having a transfer function (input signal vs. output signal) which is linear with no transfer function discontinuities. In practice, however, a power amplifier has a transfer function with nonlinear and "linear" regions. Whether the power amplifier is operating in a linear or nonlinear region depends in part on the amplitude of the input signal. For the power amplifier to achieve as near to linear operation as possible, the power amplifier is designed to operate within its linear region given the range of possible input signal amplitudes. If the input signal has an amplitude which causes the power amplifier to operate outside the linear region, the power amplifier introduces nonlinear components or distortion to the signal. When the input signal possesses amplitudes which cause the amplifier to compress, to saturate (no appreciable increase in output amplitude with an increase in input amplitude) or to shut-off (no appreciable decrease in output amplitude with a decrease in input amplitude), the output signal is clipped or distorted in a nonlinear fashion. Generally, an amplifier is characterized as having a clipping threshold, and input signals having amplitudes beyond the clipping threshold are clipped at the amplifier output. In addition to distorting the signal, the clipping or nonlinear distortion of the input signal, generates spectral regrowth or adjacent channel power (ACP) that can interfere with an adjacent frequency.

In wireless communications systems, high power amplification of signals for transmission are commonly encountered with very large peak to average power ratios (PAR). For example, in a time division multiple access (TDMA) system, such as Global System for Mobile Communications (GSM) or North American TDMA, when multiple carrier signals are combined for amplification with a power amplifier, the resulting PAR is about 9–10 dB for a large number of carriers. In a code division multiple access (CDMA) system, a single loaded 1.25 Mhz wide carrier can typically have a PAR of 11.3 dB. For orthogonal frequency division multiplexing (OFDM), multicarrier signals can have a PAR of up to 20 dB. These signals have to be amplified fairly linearly to avoid generating ACP.

Unfortunately, efficiency of the base station amplifier is inversely related to its linearity. To achieve a high degree of linearity, the amplifiers are biased to operate in the class A or "slight" class AB (meaning class AB operation that is closer to class A than to class B). Maximum AC to DC efficiency achievable for class A operation is 50%, whereas that of a class AB amplifier is between 50 and 78.5% (the latter representing the maximum efficiency of a class B amplifier). The closer the particular class AB operation is to class A, the lower the maximum efficiency. For amplifiers employing field effect transistors, the class of operation is set in accordance with the gate voltage applied, which controls the quiescent (idle) drain current. For class A operation, the gate voltage is set so that the idle drain current is approximately in the middle of the range between cutoff and saturation. Class B amplifiers are biased near cutoff, resulting in a rectified drain current waveform. Class AB amplifiers are biased in between the bias points of classes A and B.

Typically, strict linearity requirements in modern wireless communication systems dictate the use of the relatively inefficient class A or slight class AB modes. As a result, significant DC power is dissipated by the amplifiers, thereby generating heat which must be controlled to avoid degrading amplifier performance and reliability. Hence, the use of elaborate heat sinks and fans become a necessary by-product of the high linearity system. Naturally, these measures add to the cost, size and weight of the base station equipment. As the number of wireless communications users continues to grow, so do the number of base stations and the need to keep them small, light and inexpensive. Thus, a great deal of research has focused on the quest to improve amplifier efficiency in these and other systems.

Various linearization methods are used to enable the use of more cost-effective and more power efficient amplifiers while maintaining an acceptable level of linearity. Feed-forward correction is routinely deployed in modern amplifiers to improve the linearity of the main amplifier with various input patterns. The essence of the feed-forward correction is to isolate the distortion generated by the main amplifier on a feed forward path. The distortion is provided to a correction amplifier on the feed forward path which amplifies the distortion. The distortion on the feed forward path is combined with the distortion on the main signal path to cancel the distortion on the main signal path.

Predistortion techniques are commonly used to improve the performance of RF power amplifiers. Predistortion techniques distort the input signal prior to amplification by taking into account the transfer function characteristics for the amplifier. The desired amplified signal is achieved from the predistorted input signal by intentionally distorting the signal before the amplifier, so the non-linearity of the amplifier can be compensated.

FIG. 1 shows a block diagram of an adaptive power amplifier predistortion system 10. The baseband digital input signal $u_n$ on a main signal path 12 is input into the predistortion function 14 (A(.)) to produce a predistorted output $x_n$ where n is the time index. After digital to analog conversion by digital to analog (D/A) converter 16, the resulting baseband analog signal is frequency up-converted in an up-conversion process 18 to radio frequency (RF). The analog RF signals are amplified by power amplifier 20 for transmission over the air using antenna 22. A replica of the amplified analog RF signals is coupled off the main signal path 12 onto a predistortion feedback path 24. The amplified analog RF signals on the predistortion feedback path 24 are down-converted by a down-conversion process 26.

The down-converted analog signals on the predistortion feedback path 24 are provided to an analog to digital (A/D) converter 28 for conversion into the digital domain. The resulting digital signal, which represents the output of the amplifier 20, is provided to an amplifier characteristics estimation block 30 along with the digital baseband signal $x_n$ which represents the corresponding input to the amplifier 20. Given the digital signals $x_n$ prior to amplification and the digital signals $y_n$ resulting from the amplification of the analog- and frequency-converted versions of the digital signals $x_n$, the amplifier characteristics estimation block 30 can determine the characteristics or model function of the amplifier 20. Once the characteristics function of the amplifier 20 is estimated, a predistortion calculation process 34 determines the predistortion function as the inverse of the amplifier characteristics function, and the predistortion function 14 (A(.)) applied to the input signal $u_n$ is updated based on the predistortion calculation process 34.

Thus, predistortion techniques require prior understanding of the response of the amplifier. Both pure digital and RF/digital predistortion implementations use polynomial approximation to predict the amplitude and phase distortion of the RF amplifier from which the predistortion function is determined. Alternatively, the predistortion function can be directly determined using inputs and outputs of the amplifier 20. In any event, adaptive predistortion systems monitor the signals prior to and after the power amplifier to determine the predistortion function, for example by updating the coefficients of the amplifier characteristics polynomial and calculating the inverse of the amplifier characteristics polynomial. Improving the detection of signals prior to and after the amplifier can improve the determination of the predistortion function, thereby improving the performance of the predistortion system. For example, the improved detection of signals prior to and after the amplifier can improve the determination of the amplifier characteristics function from which a better inverse function can be obtained. In a standard predistortion system implementation, the input signal envelope is detected and used as a pointer to a look-up table which implements the predistortion function. The values of the look-up table are passed to a digital to analog (D/A) converter that modulates or predistorts the input signal to compensate for the distortion of the amplifier. Improvement in amplifier performance is constrained by how well the signals used in the determination of the predistortion system are detected for different input signal levels.

SUMMARY OF THE INVENTION

The present invention is a predistortion system which uses a pilot signal to determine a predistortion function which is used to produce amplitude and/or phase adjustment(s) of an input signal on a signal path. Rather than simply detecting the input signal envelope before and after distortion generating circuitry, such as an amplifier, a pilot signal is provided on the signal path prior to the distortion generating circuitry. After the distortion generating circuitry, the pilot signal is detected. The predistortion system can determine the predistortion function by using the generated pilot signal and the detected pilot signal, for example, to provide improved characterization of the amplifier amplitude and/or phase response or to directly improve the determination of the predistortion function. In certain embodiments, the predistortion function is implemented using a look-up table to produce the amplitude and/or phase adjustment values, and the pilot signal is produced on the signal path by adding the pilot signal to the amplitude and/or phase adjustment values of the look-up table.

BRIEF DESCRIPTION OF THE DRAWINGS

Other aspects and advantages of the present invention may become apparent upon reading the following detailed description and upon reference to the drawings in which.

DETAILED DESCRIPTION

An illustrative embodiment of an adaptive predistortion amplifier system is described below according to principles of the present invention which uses a pilot signal to determine the predistortion function. Determining the predistortion function can include determining a new predistortion function or model, calibrating, updating or making any changes or adjustments to a current predistortion function or model or coefficients thereof, and/or making any changes or adjustments to phase and/or amplitude adjustments made to predistort the signal on the signal path from which distortion is to be reduced.

Figure 1:
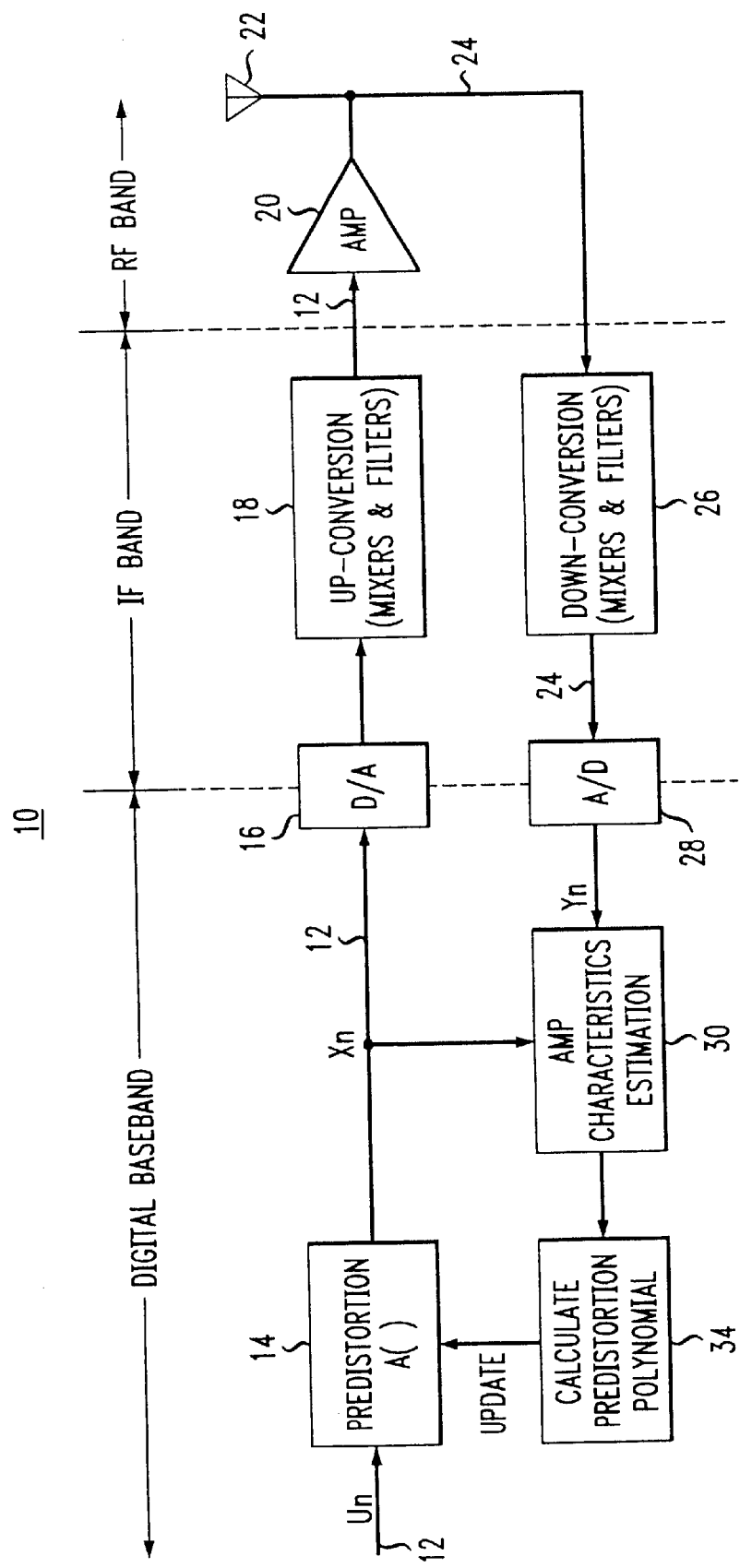
FIG. 1 shows a general block diagram of a typical adaptive power amplifier predistortion system.
Figure 2:
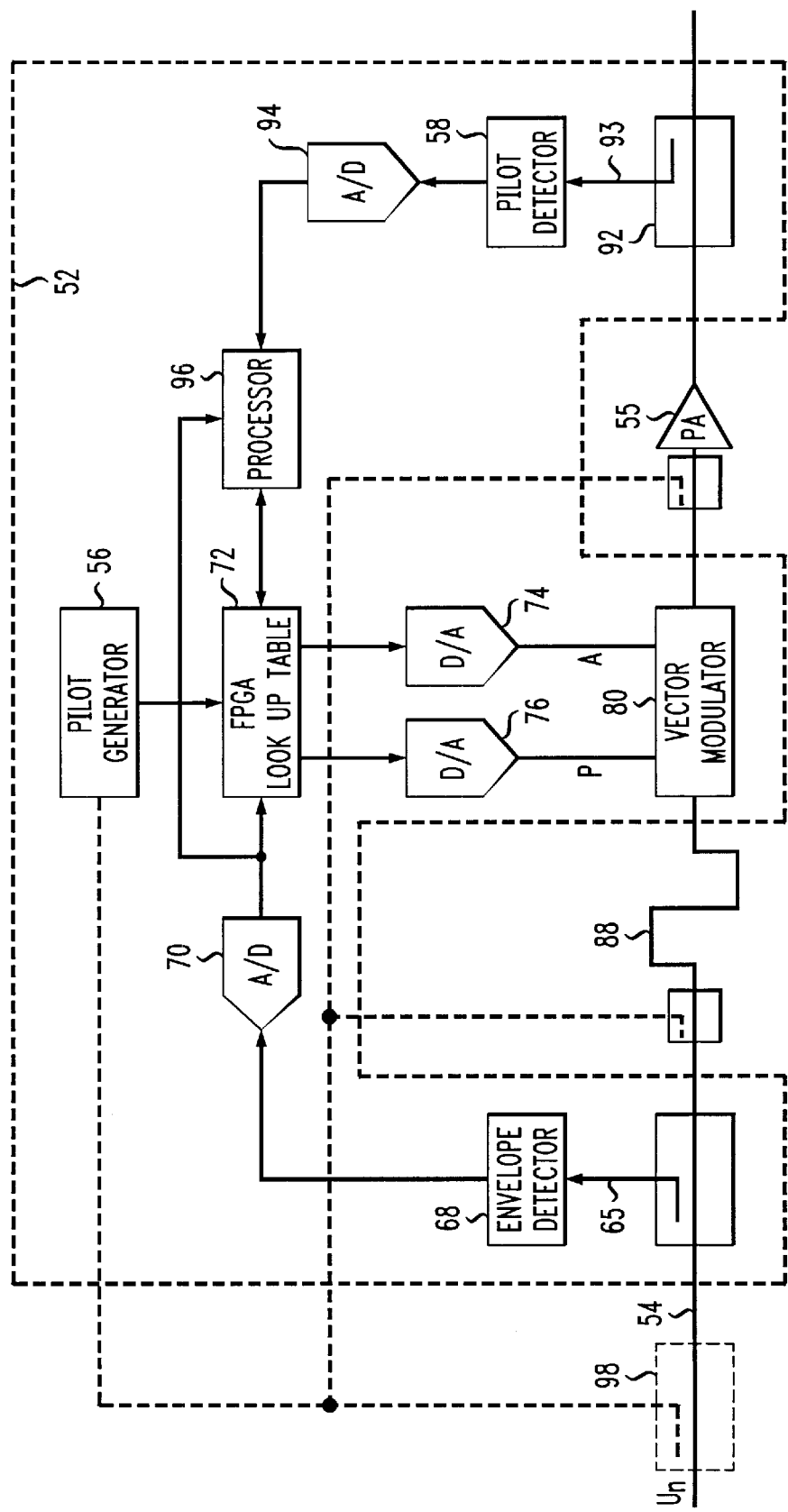
FIG. 2 shows a general block diagram of an adaptive predistortion system according to principles of the present invention.

FIG. 2 shows a general block diagram of an adaptive predistortion power amplification system 50 which uses a pilot signal to calibrate predistortion circuitry 52. In this embodiment, the predistortion circuitry 52 responds to the input signal $u_n$ by adjusting the amplitude and/or phase of an input signal $u_n$ on a signal path 54 to produce a predistorted signal $x_n$. The predistortion circuitry 52 adjusts the input signal $u_n$ by implementing a predistortion function to compensate for distortion generated by distortion generating circuitry, such as amplifier 55.

The predistortion circuitry 52 includes a pilot generator 56 which generates a pilot signal, and the pilot signal is placed on the signal path 54 prior to the amplifier 55. After the amplifier 55, the pilot signal (or a signal representative of the pilot signal on the signal path 54) is detected by a pilot detector 58. In response to the detected pilot signal, the predistortion circuitry 52 calibrates or adjusts the amplitude and/or phase adjustments for the input signal $u_n$. For example, the predistortion circuitry 52 synchronizes or maps the detected pilot signal with the generated pilot signal and an input signal value. Even though the detected pilot signal is typically very small compared to the input signal, the detected pilot signal can provide phase and/or amplitude response information for the amplifier 55. Using this information, the predistortion circuitry 52 can calibrate or adjust the predistortion function, thereby changing the phase and/or amplitude adjustments made for the input signal value. Depending on the embodiment, the predistortion function can be calibrated for each input signal value.

In this embodiment, an input signal $u_n$ on a main signal path 54 is provided to the predistortion amplifier system 50. A replica of the input signal $u_n$ is coupled off the main signal path 54 onto detection path 65 using coupler 66, and the input signal envelope is detected using envelope detector 68. The envelope signal is digitized by analog to digital converter (A/D) 70 and used as a pointer for a look-up table 72, such as a field programmable gate array (FPGA) look-up table, which implements the predistortion function. In response to the detected input signal envelope, the look-up table 72 produces values to implement the predistortion function onto the input signal on the signal path 54.

For example, the outputs of the lookup table are passed to respective digital to analog (D/A) converters 74 and 76. A vector modulator 80 uses the outputs of the look-up table 74 to modulate the respective phase (P) and amplitude (A) components of the input signal $u_n$ on the main signal path 54, thereby producing the predistorted signal $x_n$ such that the distortion produced by amplifier 55 in amplifying the input signal $u_n$ is reduced. Alternatively, the phase and/or amplitude adjustments needed to distort the input signal according to the predistortion function can be calculated by the predistortion circuitry 52 using the predistortion function and given the detected input signal envelope. To align the detected envelope of the input signal with the modulation of the corresponding portion of the input signal $u_n$ on the signal path 54, a delay 88 delays the input signal on the main signal path 54. In this embodiment, the delay 88 corresponds to the overall delay of the envelope detector 68, the A/D 70, the look-up table 72 and the D/A's 74 and 76.

The pilot signal is placed on the signal path 54 prior to the amplifier 55, and a replica of the pilot signal is coupled off the signal path 54 by coupler 92 and provided to a pilot detection or feedback path 93 after the amplifier 55. On the pilot detection path 93, the pilot detector 58 detects the pilot signal, and the detected pilot signal measurement(s) is provided to the predistortion circuitry 52. The pilot signal can be detected by filtering at the pilot signal frequency to allow the pilot signal to pass while attenuating the input signal after which phase and/or amplitude measurement(s) can be produced of the pilot signal to the predistortion circuitry 52. Depending on the embodiment, the generated pilot signal could be a spread spectrum pilot signal which is de-spread on the pilot detection path to raise the pilot signal while lowering the input signal after which the phase and/or amplitude measurement(s) are performed.

In this embodiment, the predistortion circuitry 52 includes an analog to digital converter 94 which analog-to-digitally converts the detected pilot signal measurement(s). The digital representation of the detected pilot signal measurement(s) is provided to processing circuitry 96. The processing circuitry 96 also receives the pointers to the look-up table 72 which represent the detected input signal envelopes. The processing circuitry 96 synchronizes or maps the detected pilot signal measurement(s) with the generated pilot signal and/or the input signal envelope and performs a waveform comparison of the generated pilot signal and the output pilot signal given the detected input signal envelope. In doing so, the processing circuitry 96 can determine a phase and amplitude response for the amplifier and/or the phase and/or amplitude distortion generated by the amplifier 55. Using this amplitude and/or phase distortion or response information, the processing circuitry 96 can calibrate the look-up table 72, for example by updating the amplifier characteristics polynomial and/or the predistortion function and calculating and loading the updated values into the table. Depending on the embodiment, the calibration of the look-up table 72 can be done for an input signal value at a time and/or without approximations across an input signal value range as is usually done. The calibration can also be done with actual input or traffic signals running through the amplifier 55, allowing the amplifier 55 to be auto-calibrated without disturbing the traffic signals.

Depending on the embodiment, the predistortion function can be generated by first estimating the characteristics of the amplifier 55, for example by finding the coefficients which minimize the error between the expected pilot signal output of the amplifier 55 and the pilot signal output of the amplifier 55 given the input signal $u_n$ or $x_n$. After the amplifier characteristics are determined, the predistortion function can be determined and/or updated by finding the inverse to the amplifier characteristics function. Alternatively, the predistortion function can be directly determined using the known pilot signal and the amplifier output pilot signal, for example by minimizing the error between the actual generated pilot signal and the amplifier output pilot signal.

Depending on the embodiment, the pilot signal can be coupled onto the signal path 64 by a coupler 92 or added to the values in the look-up table 72. In this embodiment and in accordance with certain principles of the present invention, the output of the look-up table 72 is not only the amplitude and/or phase adjustment values resulting from the predistortion function or table implemented in the look-up table 72 but also the digital representation of the pilot signal which is added to the output of the look-up table 72. As such, the pilot signal values can be added to the values output from the look-up table to provide the pilot signal on the main signal path by modulating or adding the pilot signal onto the adjustment values, thereby reducing the circuitry required to inject the pilot signal onto the main signal path 54. Alternatively, the pilot signal could be directly added to the input signal, for example at baseband in the digital domain.

Thus, the predistortion system and method uses a pilot signal to determine the predistortion function (which can include updating, calibrating or changing the predistortion function, coefficients and/or adjustment values for a given signal value(s) or range of values). Because the generated pilot signal is known, the calibration of the predistortion generation may be more readily achieved for different signal values. Typically, the input signal envelope is detected prior to the amplifier and the corresponding amplified signal is detected on a feedback path. As would be understood by one of skill in the art, the predistortion function is calibrated based on these measurements, but basing the calibrations or adjustments on a changing input signal and the resulting amplified signal may be more difficult. Instead, a constant or known pilot signal can be used along with the changing signal values to more readily detect or determine the amplitude and/or phase distortion introduced by the amplifier for changing signal values, thereby improving the ability to calibrate the predistortion applied to the signal values.

In addition to the embodiment described above, alternative configurations of the predistortion calibration system according to the principles of the present invention are possible which omit and/or add components and/or use variations or portions of the described system. Depending on the embodiment, the predistortion circuitry 52 can be comprised of different components which determine the predistortion function (including updating, calibrating, compensating or changing in any way the manner in which the signal(s) on the main signal path 54 is predistorted for given signal value(s)) based on a measurement or detection of a pilot signal which is input into the main signal path 54 prior to the amplifier 55 and detected or measured after the amplifier 55. Additionally, phase, amplitude and/or signal envelope detectors can be located on the path 94 to perform those or other measurements of the input signal and/or the pilot signal prior to the amplifier 55 on the path 54, and phase, amplitude and/or envelope detectors can be located on the feedback path 93 to perform those and other measurements on the pilot signal and/or the signal output from the amplifier 55. Samples or replicas of signals or pilot signal at different points on the signal path 54 prior to and/or after the amplifier 55 can be provided to the predistortion circuitry 52, including but not limited to the input signal $u_n$, the predistorted signal $x_n$, the pilot signal prior to the amplifier 55 and/or the amplified signal or pilot signal.

The embodiment of the predistortion system has been described as being used with a particular adaptive predistortion architecture, but the predistortion system can be used in any predistortion system which is used to reduce the distortion generated by any distortion generating circuitry which acts on a signal. Moreover, different types of pilot signals can be used by the predistortion system, such as a continuous wave (CW) pilot, a spread spectrum pilot, a modulated pilot, a pilot of varying frequency, or a pilot having different frequency components. Depending on the application, the predistortion system can be positioned in or in addition to a feed forward, or other linearization or efficiency-improving techniques. The predistortion calibration system and portions thereof can be implemented at, baseband, intermediate frequency (IF) and/or radio frequency (RF) in the digital and/or analog domain.

The predistortion system has been further described as a particular configuration, but it should be understood that the calibration system and portions thereof can be implemented in application specific integrated circuits, software-driven processing circuitry, firmware, programmable logic devices, hardware and/or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of producing predistortion, said method comprising:

producing a pilot signal on a signal path prior to a distortion generating circuit;

detecting said pilot signal after said distortion generating circuit;

determining a predistortion function in response to said detected pilot signal; and determining for an input signal value an amplitude and/or phase adjustment as a function of an input signal value, said generated pilot signal and said detected pilot signal.

2. The method of claim 1 further including:

distorting a signal on said signal path using said predistortion function to produce a predistorted signal on said signal path for said distortion generating circuit.

3. The method of claim 2 wherein said step of distorting includes:

adjusting amplitude and/or phase of said signal on said signal path using said predistortion function.

4. The method of claim 3 comprising:

determining amplitude and/or phase adjustments for input signal values using said predistortion function.

5. The method of claim 1 wherein said step of determining includes:

updating coefficients of an amplifier characteristics function;

calculating an inverse to said amplifier characteristics function as said predistortion function.

6. The method of claim 1 comprising mapping said detected pilot signal with a corresponding input signal value.

7. The method of claim 1 comprising the step of:

generating a pilot signal.

* * * * *